US012025662B1

United States Patent
Li et al.

(10) Patent No.: US 12,025,662 B1
(45) Date of Patent: Jul. 2, 2024

(54) ANALOG BUILT-IN SELF-TEST SCHEME FOR HIGH VOLUME POWER MANAGEMENT INTEGRATED CIRCUIT PRODUCTS

(71) Applicant: Avago Technologies International Sales Pte. Limited, Singapore (SG)

(72) Inventors: Shengyuan Li, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/113,547

(22) Filed: Feb. 23, 2023

(51) Int. Cl.
*G01R 31/3187* (2006.01)
*G01R 31/317* (2006.01)
*G01R 31/3177* (2006.01)

(52) U.S. Cl.
CPC ... *G01R 31/3187* (2013.01); *G01R 31/31727* (2013.01); *G01R 31/3177* (2013.01)

(58) Field of Classification Search
CPC .......... G01R 31/3187; G01R 31/31727; G01R 31/3177
See application file for complete search history.

(56) References Cited

U.S. PATENT DOCUMENTS

2020/0371139 A1* 11/2020 Dubois ............ G01R 19/16519

* cited by examiner

*Primary Examiner* — Thien Nguyen
(74) *Attorney, Agent, or Firm* — Foley & Lardner LLP

(57) ABSTRACT

A circuit includes first and second power devices that include first and second field effect transistors (FET). A first channel is located between a first drain and a first source of first FET and a second channel is located between a second drain and a second source of second FET. First and second drains are coupled to first common junction and first and second sources are coupled to second common junction. The first common junction is configured to receive a current. A switch controller is coupled to a first gate of the first FET and to a second gate of the second FET to apply a bias voltage to the first and second gates one by one and in turn. An analog to digital converter coupled to first common junction and second common junction and configured to alternately digitize a voltage of the first channel or the second channel.

20 Claims, 3 Drawing Sheets

US 12,025,662 B1

ANALOG BUILT-IN SELF-TEST SCHEME FOR HIGH VOLUME POWER MANAGEMENT INTEGRATED CIRCUIT PRODUCTS

TECHNICAL FIELD

The present description relates generally to integrated circuit testing and, in particular, to testing on the semiconductor substrate.

BACKGROUND

Switching power supplies use switching power devices that include power field effect transistors (FET). Measuring the drain-source resistance of the power FETs, when the FET is on, is used for testing the FETs. The power FETs may cover up to seventy five percent of the semiconductor area and are tested. Automated test equipment (ATE) uses probe needles that add parasitic resistance, especially after the probe is used several times. In addition, this method may transfer particles between wafters that are tested. It is highly desirable to find another method for testing the power FETs.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
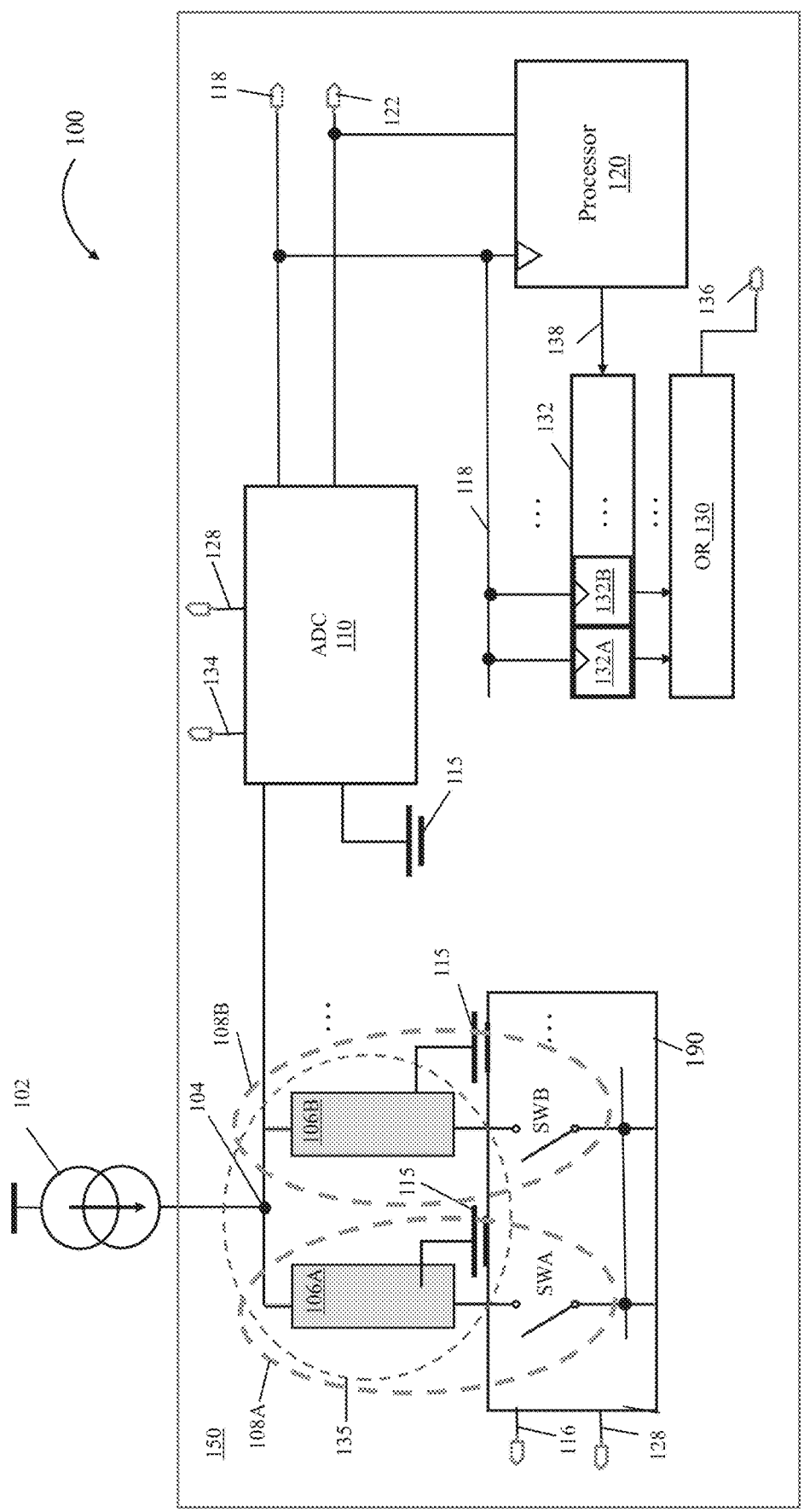
FIG. 1 illustrates a high-level architecture for a built-in self-test circuit disposed on a substrate, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" or "placed" on a substrate, it is to be understood that the element is created or produced by semiconductor processing methods on the substrate.

The circuits developed on substrate are tested by an automated test equipment (ATE) that uses probe needles. The probe needles, especially after being used a few times, add parasitic resistance that are not negligible compared to the resistance that is being tested. In addition, this method may transfer particles between wafters that are being tested. Also, switching mode power supplies that user power FETs and the power FETs have a large size that covers a significant portion (such as 75 percent or more) of the substrate area are also tested. Thus, large areas covered by power FETs require testing.

An analog self-test circuit is introduced below that incorporates a testing circuit on the substrate for testing the large area of the power FETs. In some embodiments, a resistance between drain and source of an FET is tested when the FET is turned on. In some embodiments, when the FET operates in an ohmic region the FET is on. In some embodiments, when the FET is in the ohmic region, a voltage $V_{gs}$ between a gate of the FET and a source of the FET is set such that a charge carrying channel is created in a gate region of the FET that includes charge carrying components, e.g., electrons. In some embodiments, when the FET is on, the voltage $V_{gs}$ does not vary but a voltage between a drain of the FET and the source of the FET varies while a current $I_{ds}$ between the drain of the FET and the source of the FET is measured and an ohmic resistance $R_{ds}$ between the drain and source of the FET is measured. The circuit couples a drain of each power FET to a separate switch. In some embodiments, the sources of the power FETs are connected to each other at a second common junction that is also connected to the ground. The drains of the power FETs are connected to each other, at a first common junction, and, thus, the power FETs are connected as parallel circuits. A separate switch is connected to each gate of the power FETs. A known current amount, e.g., a current source providing a predetermined amount of current, is delivered to the first common junction and a voltage drop between the first common junction and the second common junction, e.g., the ground, is measured by providing the voltage drop to an analog to digital converter (ADC) on the substrate to digitize the voltage by converting the voltage drop to a numeric value and providing the numeric value by the ADC. In some embodiments, when the FET is off, the voltage $V_{gs}$ is set such that no charge carrying channel is created in the gate region and no current passes between the drain and source of the FET. In some embodiments, when the FET is in the ohmic region, a channel of the FET between source and drain regions of the FET are conductive and has the ohmic resistance $R_{ds}$.

The switches to the gates of the power FETs are turned on one by one and in turn, e.g., alternately, such that at each instance of time, only one switch is closed and other switches are open. Thus, at each instance of time, e.g., at each moment, only one gate of the FETs is biased and that FET is turned on but other FETs are turned off. A clock signal, e.g. a clock signal change between two voltage levels (e.g., between a first voltage level and a second voltage level higher than the first voltage level), defines when the switches turn on or off. Thus, based on the clock signal, e.g., a clock signal change between logical-zero and logical-one (e.g., synchronized with the clock signal), the FETs are turned on and off. Thus, at each clock only one FET is turned on and the other FETs are turned off. In the next instance of time, the FET that was turned on become turned off and another FET that was turned off becomes turned on. Thus, the voltage drop between source and drain of the FETs are fed one by one and in turn such that at each instance of the time, e.g., at each turn, the voltage drop between source and drain of one of the FETs is fed into the ADC. The ADC digitizes the voltage and give the voltage to a comparator or a processor. In some embodiments, the processor divides the voltage by the predetermined amount of current of the current source and determines the source-drain resistance $R_{ds}$ of the FET that is turned on. In some embodiments, a turn is a duration of time that the voltage is applied to one switch to close the switch, e.g., the voltage is applied to one FET to turn on that FET and the voltage is not applied to the other FETs and then at the next same duration of time the voltage is applied to a next FET and not applied to the other FETs and etc. Thus, in some embodiments, the voltage is applied one by one to only one FET and after all FETs are turned on, the turning on repeats periodically. In some embodiments and because the predetermined amount of current of the current source is known, the voltage drop between source and drain of the FETs is compared with a predefined source-drain voltage range. If the voltage drop is within the predefined source-drain voltage range, generates a logical-zero, e.g., false, flag and if the voltage drop is not within the predefined source-drain voltage range generates a logical-one, e.g., a true, flag indicating a bad FET. The predefined source-drain voltage range depends on a width and length of channel, impurity type, etc. In some embodiments, the predefined source-drain voltage range is between 160 millivolts (mV) and 240 mV. In some embodiments, the predefined source-drain voltage range is between 320 mV and 480 mV. In some embodiments, the predetermined amount of current is about 500 milliamperes (mA).

In some embodiments, the processor compares the determined source-drain resistance $R_{ds}$ with a resistance reference range and if within range generates a logical-zero, e.g., false, flag and if does not fit within resistance reference range generates a logical-one, e.g., a true, flag indicating a bad FET. In some embodiments, the FETs are tested one by one and in turn based on the clock signal and the flags are pushed by the processor into a buffer, e.g., to sequential cells of a first-in first-out (FIFO) buffer. A logical OR-gate uses the values of the cells of the FIFO buffer as input and generates an output, which is a logical OR of the cell values. Having a logical-one as output of the logical OR-gate indicates that at least the channel region of one FET is defective. As the additional circuits use additional space on the substrate, the subject technology introduced here is used for critical circuits on a chip. In some embodiments, the critical circuits are one or more circuits that consume the most average power compared to the other circuits and together consume more than fifty percent of the power. In some embodiments, the critical circuits are one or more circuits that are required to constantly operate. In some embodiments, the channel region of a transistor or a region of the substrate is defective when the substrate or the channel region of the substrate has particles inside or on top of the substrate, the substrate is contaminated, or the doping of the substrate is not uniform. In some embodiments, the source-drain resistance reference range is between 320 milliohms and 480 milliohms. In some embodiments, the source-drain resistance reference range is between 640 milliohms and 960 milliohms.

FIG. 1 illustrates a high-level architecture for a built-in self-test circuit 100 disposed on a substrate 150, according to various aspects of the subject technology. In some embodiments, the current source 102 is a single current source that is also an external current source and is not part of the circuit 100. The circuit 100 includes two or more channel regions, e.g., channel regions 106A and 106B, on the substrate 150. The channel regions 106A and 106B are connected to each other and to a common junction 104 from one end and to each other and to another common junction, e.g., a ground 115, from another end. The channel regions 106A and 106B are distributed in a region 135 of the substrate 150. The two channel regions 106A and 106B may act as a resistor from the common junction 104 to the ground 115 when a respective switch to the two channel regions 106A and 106B are on. In some embodiments, a common junction is where two or more connection lines are coupled to each other.

FIG. 1 shows a switch controller 190 for controlling switches SWA and SWB. While switches SWA and SWB are shown, the switch controller 190 may control three or more switches. The switching (e.g., on and off) of the switches SWA and SWB is synchronized by the clock signal line 128. When a switch is closed, a voltage line 116 is applied via the closed switch SWA and SWB to the two channel regions 106A or 106B. Applying the voltage line 116 through the switches SWA and SWB causes the two channel regions 106A and 106B on the substrate to act as a resistor. In some embodiments, the channel regions 106A and 106B are transistor channels, e.g., FET channels, and the voltage line 116 applies through the switches SWA and SWB to gates of the transistors to turn on the FETs. As shown in FIG. 1, the two channel regions 106A or 106B are coupled in parallel between the common junction 104 and the ground 115.

FIG. 1 also shows the ADC 110 that is connected between the common junction 104 and the ground 115 and digitizes the input voltage between the common junction 104 and the ground 115. As shown, the ADC 110 is also connected to a reference voltage 134 and the clock signal line 128 such that the ADC 110 synchronizes with the switch controller 190, e.g., synchronizes with turning on and off of the switches SWA and SWB. In some embodiments, the switches SWA and SWB are includes in the switch controller 190 and in other embodiments, the switches SWA and SWB are separate from the switch controller 190. FIG. 1 also shows a processor 120 and a FIFO 132 that includes two FIFO cells 132A, 132B, or more. In some embodiments, FIFO 132 includes three FIFO cells 132A, 132B, 132C, or more. In some embodiments, FIFO 132 includes three FIFO cells 132A, 132B, 132C, 132D, or more. As shown the processor 120 and the FIFO cells 132A and 132B are coupled to the ready signal 118, which is an output signal of the ADC that indicates the digitized voltage is ready. In some embodiments, the ready signal 118 is used for synchronizing the processor 120 and the FIFO 132. The processor 120 receives the digitized voltage through the connection line 122, e.g., a voltage line, compares the digitized voltage with a predefined source-drain voltage range and generates a logical output result. The logical output result is pushed, by the processor, through a connection line 138 to the FIFO 132. Based on comparing the digitized voltage with the predefined source-drain voltage range, the output is the logical-zero, e.g., false, indicating that the digitized voltage does not violate the predefined source-drain voltage range. In some embodiments, the output is the logical-one, e.g., true, indicating that the digitized voltage violates the predefined source-drain voltage range. The logical output results for different FETs are generated synchronized with the ready signal 118 and are pushed to the FIFO cells 132A and 132B, etc. By synchronizing the processor 120 and the FIFO 132, the ready signal 118, e.g., a jump of the ready signal 118, triggers the processor to push a logical output result into the FIFO 132. The processor 120 pushes the logical output results, one after the other, to the FIFO 132. The logical output results in the FIFO cells 132A and 132B are passed to the logical OR-gate 130. The logical OR-gate 130 determines the output as the output 136 of the circuit, which is a logical-OR of the logical-zero or logical-one values, e.g., binary values, of the cells of the FIFO 132. Also, as shown, a sub-circuit 108A or 108B includes one of the channel regions 106A and 106B that are coupled to the ground 115 and one of the switches SWA and SWB respectively.

Figure 2:
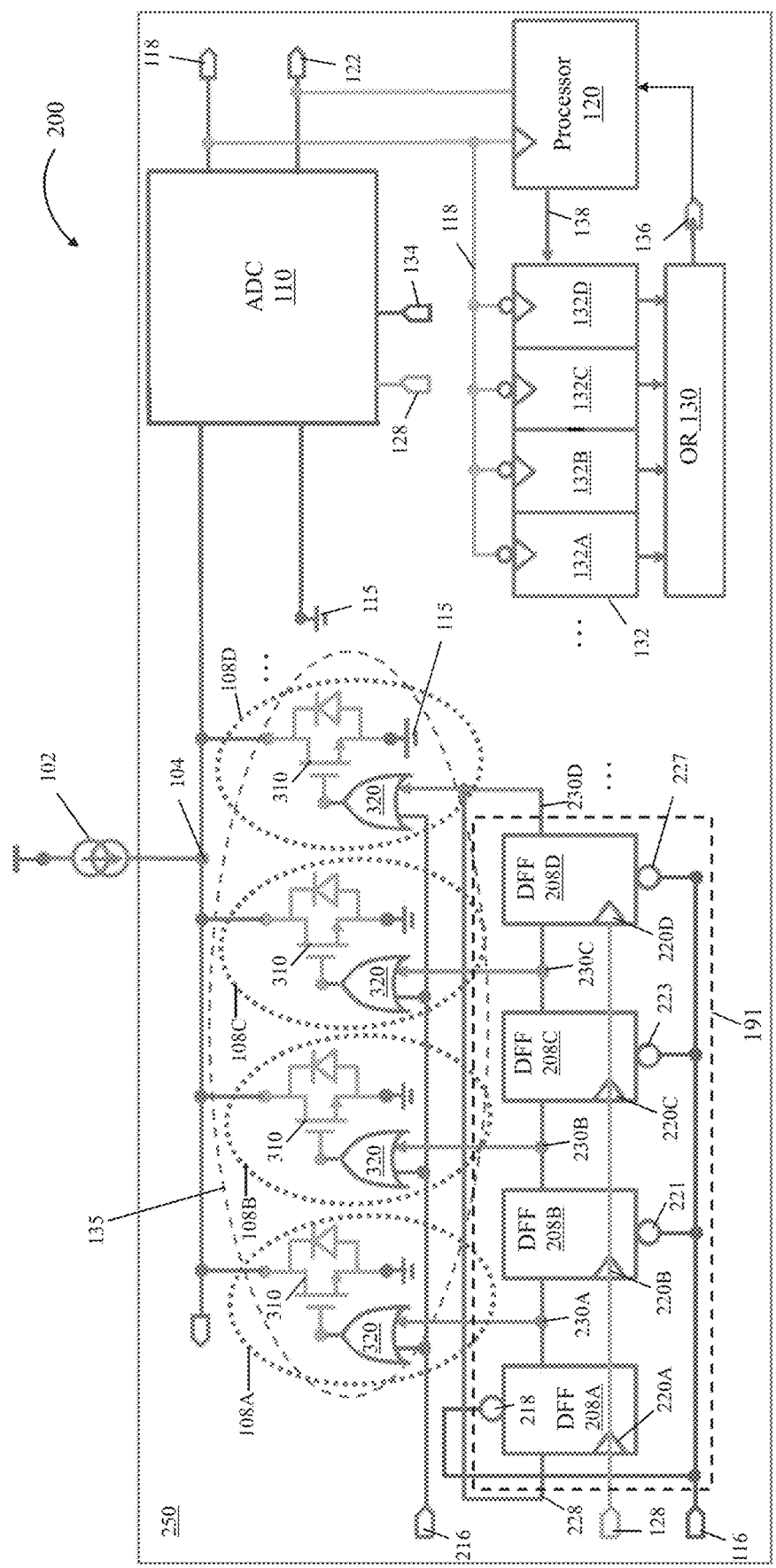
FIG. 2 illustrates an exemplary implementation of a built-in self-test circuit disposed on a substrate, according to various aspects of the subject technology.

FIG. 2 illustrates an exemplary implementation of a built-in self-test circuit 200 disposed on a substrate 250, according to various aspects of the subject technology. FIG. 2 shows at least four sub-circuits, e.g., sub-circuits 108A, 108B, 108C, and 108D. The sub-circuits 108A, 108B, 108C, and 108D are distributed, e.g., uniformly distributed, in the region 135. Each one of the sub-circuits 108A, 108B, 108C, and 108D include a transistor 310, e.g., an FET, and the transistor 310 has a channel region. Thus, the region 135 includes four channel regions of transistors 310. In some embodiments, a gate region of the transistor 310 between the source region and the drain region is the channel region 106A or 106B. Also, FIG. 2 shows a switch controller 191, consistent with the switch controller 190, which includes at least four D flip flops (DFF) 208A, 208B, 208C, and 208D that are connected to the clock signal line 128 and the voltage line 116. As shown the voltage line 116 is coupled to a preset node 218 of the DFF 208A and to reset nodes 221, 223, and 227 of the DFF 208B, the 208C, and the 208D, respectively. Thus, initially, an output 230A of DFF 208A is set to logical-one and the outputs 230B, 230C, and 230D of the DFF 208B, 208C, and 208D, respectively, are set to logical-zero. Additionally, the clock signal line 128 is coupled to clock nodes 220A, 220B, 220C, and 220D of the DFFs 208A, 208B, 208C, and 208D, respectively. Thus, after the first clock cycle, e.g., clock pulse, the output 230A of the DFF 208A becomes logical-zero and the output 230B of the DFF 208B becomes logical-one. Therefore, the logical-one moves to the right after each clock cycle until circulates back through an input 228 to the output 230A of the DFF 208A after four clock cycles. In some embodiments, the sub-circuits 108A, 108B, 108C, and 108D are uniformly distributed in the region 135 when the sub-circuits 108A, 108B, 108C, and 108D cover the region 135 and have effectively equal distance with each other. In some embodiments, the sub-circuits 108A, 108B, 108C, and 108D are power devices.

One input node of each one of OR-gates 320 of the sub-circuits 108A, 108B, 108C, and 108D is connected to a connection line 216, which is coupled to the ground. Thus, an output of the OR-gate 320 becomes logical-one only when the output of the corresponding DFF becomes logical-one. As shown the OR-gates 320 of the sub-circuits 108A, 108B, 108C, and 108D act as the switches and, as noted, the transistors 310 provide the channels. After each clock cycle of the clock signal line 128 of the switch controller 191, the logical-one moves one step to the right and a channel region of the sub-circuit associated with that DFF conducts the current supplied by the current source 102 and delivered at the common junction 104 that is coupled to the drains of the transistors 310. FIG. 2 has the ADC 110 and the processor 120 of FIG. 1. In FIG. 2, the FIFO 132 has four FIFO cells 132A, 132B, 132C, and 132D instead of the two FIFO cells of FIG. 1. In addition, in each sub-circuit 108A, 108B, 108C, or 108D, there is a body diode 305 between the drain and source regions. When the FET is off, the body diode 305 becomes reverse biased to have a negligible leakage current. In some embodiments, when the output of the OR-gate 320 becomes logical-one, the OR-gate 320 applies a voltage, e.g., a bias voltage, to the transistors 310 to turn on the transistor 310 in ohmic region such that voltage between source and drain of the transistor 310 is $R_{ds}$ times drain-source current and, thus, the voltage between source and drain is proportional to the resistance $R_{ds}$ of the channel region of the transistor 310.

In some embodiments, a channel region of at least one of the FETs is an n-type channel. In some embodiments, a channel region of at least one of the FETs is an p-type channel. In some embodiments, the switch controller 191, the processor 120, the ADC 110, the FIFO 132, the logical OR-gate 130, and the switches are adjacent to the region 135, e.g., the switch controller 191, the processor 120, the ADC 110, the FIFO 132, the logical OR-gate 130, the switches, and the region 135 are adjacent to each other. In some embodiments, the switches, e.g., the switches SWA and SWB or the OR-gates 320, are inside the region 135. In some embodiments, components are on a substrate are adjacent when the components are in a same die of the substrate. As shown in FIG. 2, the transistors 310, e.g., FETs, are coupled in parallel between the common junction 104 and the ground 115. Also, at each instance of time, only one output 230A, 230B, 230C, or 230D has voltage, e.g., a positive voltage, and only one gate of the transistors 310 is connected to the voltage and the transistor 310 is on. The voltage is disconnected from gates of the other transistors 310 and the other transistors are off.

Figure 3:
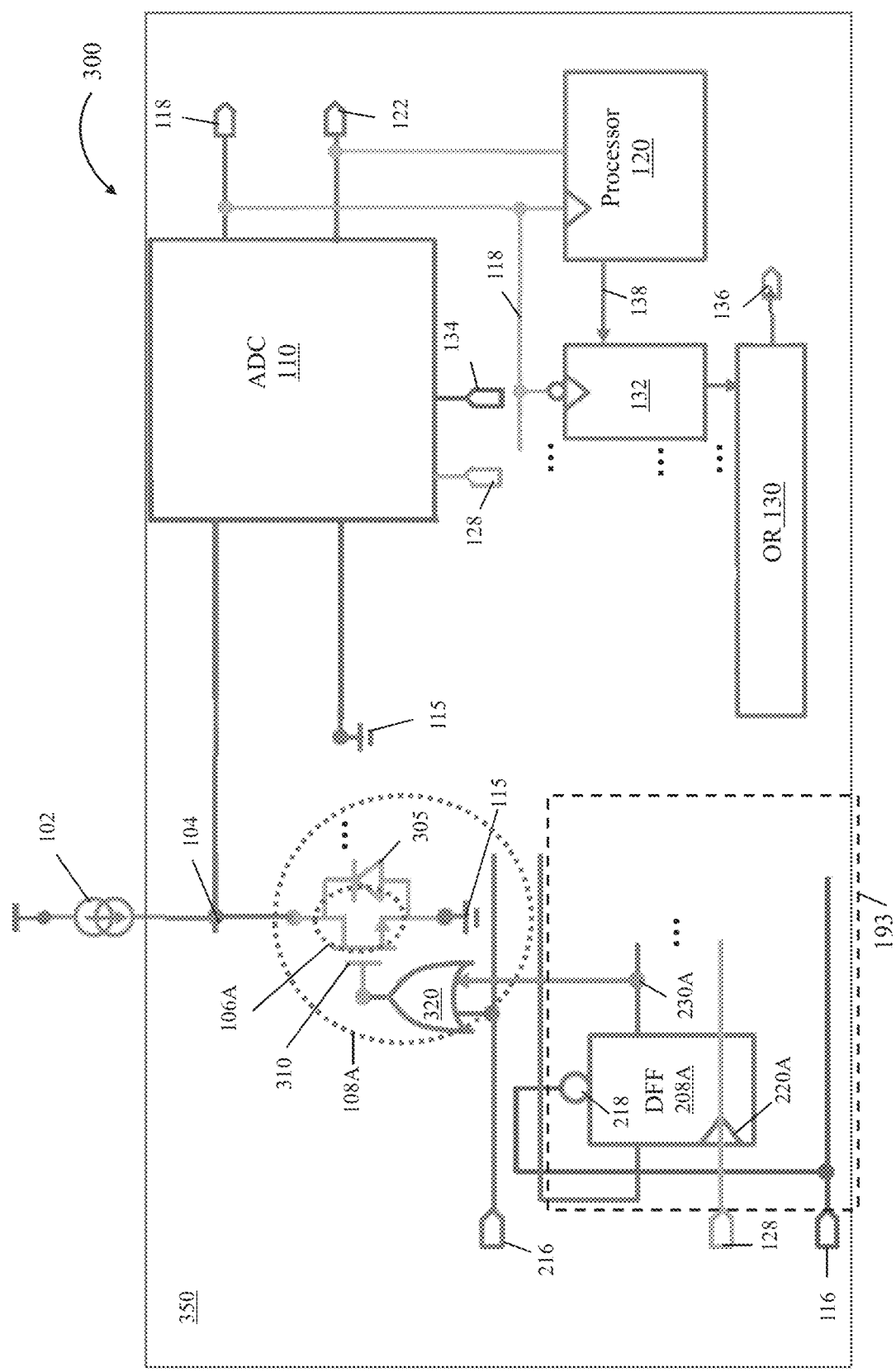
FIG. 3 illustrates a built-in self-test circuit disposed on a substrate, according to various aspects of the subject technology.

FIG. 3 illustrates a built-in self-test circuit 300 disposed on a substrate 350, according to various aspects of the subject technology. The switch controller has one or more sub-circuits but shows only one sub-circuit 108A. Also, the switch controller 193, which is consistent with the switch controller 19 has one or more DFFs but shows only one DFF 208A coupled to the voltage line 116 and the clock signal line 128, via a preset node 218 and clock node 220A, respectively. FIG. 3 also shows one or more sub-circuit, e.g., the sub-circuit 108A that includes the channel region 106A. The channel region 106A is consistent with the channel regions 106A and 106B of FIG. 1. The channel region 106A of FIG. 3 is provided by the gate region of the transistors 310. The built-in self-test circuit 300 also includes the ADC 110 that is coupled to the clock signal line 128, reference voltage 134, the ground 115, the common junction 104, the ready signal 118, and the connection line 122. FIG. 3 also shows the processor 120 that is coupled to the ready signal 118 and the connection line 122, the FIFO 132 that is coupled to the ready signal 118 and receives the logical output result via the connection line 138 from the processor 120, and the logical OR-gate 130. In some embodiments, the logical OR-gate 130 determines the output 136 of the circuit and if the output 136 is logical-one, the circuit or the processor 120 that receives the output 136 provides an indication that the substrate 350 is defective.

The subject technology discussed above provides a built-in self-test circuit on the substrate, e.g., on the manufactured chip that can be added for critical devices on the chip. There is no need for ATE test and parasitic resistance of the probes are completely avoided.

According to aspects of the subject technology, a circuit includes a substrate and first and second power devices disposed on the substrate. The first power device includes a first field effect transistor (FET) and the second power device includes a second FET. The circuit includes a first channel region located between a first drain and a first source of first FET and a second channel region located between a second drain and a second source of second FET. First and second drains are coupled to each other at a first common junction and first and second sources are coupled to each other at a second common junction. The first common junction receives a current. The circuit also includes a switch controller coupled to a first gate of the first FET and to a second gate of the second FET. The switch controller applies a bias voltage to the first and second gates one by one and in turn such that at each turn, one FET is on and other FET is off. The circuit further includes an analog to digital converter (ADC) coupled to the first common junction and the second common junction to alternately digitize a voltage of the first channel region or the second channel region.

In an aspect of the subject technology, the circuit further includes a processor disposed on the substrate that receives the digitized voltage of the first channel region or the second channel region, compares the digitized voltage with a predefined source-drain voltage range and generates a binary output. The binary output is true if the digitized voltage is not within the predefined source-drain voltage range and the binary output is false if the digitized voltage is within the predefined source-drain voltage range. The processor receives, in turn, the digitized voltage of the first and second FETs and provides the binary output corresponding to the first and second FETs. In an aspect of the subject technology, the circuit further includes a buffer having first and second cells that are coupled to the processor to receive the binary outputs corresponding to the first and second FETs in turn. The circuit further includes an OR-gate coupled to each output of the first and second cells of the buffer to provide a logical-OR of the binary outputs corresponding to the first and second FETs and generate the logical-OR as output of the circuit. In an aspect of the subject technology, the first and second FETs are connected in parallel between the first common junction and the second common junction, and wherein the second common junction is coupled to a ground. In an aspect of the subject technology, a current source coupled to the substrate to provide a predetermined amount of current. The current source is coupled to drains of the first and second FETs at the first common junction to provide the current. In an aspect of the subject technology, the circuit further includes first and second switches disposed on the substrate. The switch controller is coupled to each gate of the first and second gates via a separate switch of the two or more switches. The switch controller closes and opens the first and second switches one by one and in turn such that at each turn, one switch of the first and second switches is closed and other switch is open. A voltage line is connected to a gate of the FET coupled to the closed switch to turn on the FET coupled to the closed switch in an ohmic region. The voltage line is disconnected from the gate of the other FET coupled to the open switch to turn off the other FET. In an aspect of the subject technology, a clock signal line is coupled to the first and second switches and is coupled to the ADC to synchronize the ADC with turning the two or more switches open or closed.

According to aspects of the subject technology, a circuit includes a substrate, a first field effect transistor (FET) disposed on the substrate, a first channel region of the first FET between a first drain and a first source of the first FET. The first drain of the first FET is connected to a first common junction, the first common junction receives a current, and the first source of the first FET is connected to a second common junction. The circuit also includes a first switch disposed on the substrate and coupled between a voltage line and a first gate of the first FET to apply a bias voltage to the first gate and a switch controller coupled to the first switch such that the switch controller turn the first switch closed or open in response to a clock signal change. The circuit further includes an analog to digital converter (ADC) coupled between the first junction and the second junction and to digitize a voltage between the first source and the first drain and provide a digitized voltage. The digitized voltage is provided in response to the clock signal change and the clock signal change closes the first switch and turns the first FET on.

In an aspect of the subject technology, the first channel region of the first FETs is an n-type channel and the clock signal change is from a first voltage level to a second voltage level, higher than the first voltage level. In an aspect of the subject technology, the circuit further includes second and third FETs that include second and third channel regions respectively between drain and source of the second and third FETs such that drains of the second and third FETs are connected to the first common junction and sources of the second and third FETs are connected the second common junction. Also, the circuit further includes second and third switches that are disposed on the substrate such that the voltage line is coupled via the second and third switches to gates of the second and third FETs to apply the bias voltage to the gates of the second and third FETs respectively. The switch controller to make the first, the second, and the third switches closed or open, in turn, in response to the clock signal change such that at each turn, one FET is biased to be on and other FETs are off, and the ADC digitizes the voltage between the source and the drain of the FET that is on. In an aspect of the subject technology, the first, second, and third FETs are uniformly distributed in the substrate. In an aspect of the subject technology, the circuit further includes a processor disposed on the substrate to receive the digitized voltage, compare the digitized voltage with a predefined source-drain voltage range, and generate a binary output, such that the binary output is true if the digitized voltage is not within the predefined source-drain voltage range and the binary output is false if the digitized voltage is within the predefined source-drain voltage range. Also, the processor receives, in turn, digitized voltages of the first, second, and third FETs and provides binary outputs corresponding to the first, second, and third FETs. In an aspect of the subject technology, the circuit further includes a buffer coupled to the clock signal line and to the processor. The buffer is disposed on the substrate and has three cells. The buffer receives binary outputs corresponding to the first, second, and third FETs in turn, and pushes the binary outputs, one by one, to the three cells of the buffer. Also, an OR-gate is coupled to each output of the three cells of the buffer to generate a logical-OR of the binary outputs corresponding to the first, second, and third FETs and to provide the logical-OR as an output of the circuit. In an aspect of the subject technology, in response to the output of the circuit being a logical-one, the circuit is configured to provide an indication that the substrate is defective.

According to aspects of the subject technology, a circuit includes a substrate and two or more channel regions disposed on the substrate such that each channel region has a first end and a second end, and the first end of the two or more channel regions are coupled to a first common junction and the second end of the two or more channel regions are coupled to a second common junction and the second common junction is coupled to a ground. The circuit includes a switch controller coupled to the two or more channel regions such that the switch controller applies a bias voltage to the channel region one by one and in turn, and in response to applying the bias voltage to each channel region, the channel region becomes conductive, and at each moment, one channel region of the two or more channel regions is conductive and other channel regions of the two or more channel regions are non-conductive. The circuit further includes an ADC coupled to the first common junction and the second common junction to digitize one by one and in turn a voltage between first common junction and the second common junction of a channel region that is conductive and provide a digitized voltage.

In an aspect of the subject technology, two or more switches are disposed on the substrate, such that a separate switch of the two or more switches is coupled to each channel region of the two or more channel regions. In an aspect of the subject technology, the substrate is coupled, at the first common junction, to a current source to provide a current through the channel region that is conductive. In an aspect of the subject technology, the circuit further includes a processor disposed on the substrate and to receive the digitized voltage, compare the digitized voltage with a predefined source-drain voltage range, and generate a binary output. The binary output is true if the digitized voltage is not within the predefined source-drain voltage range and the binary output is false if the digitized voltage is within the predefined source-drain voltage range, and the processor receives, in turn, digitized voltages of the two or more channel regions and provides binary outputs corresponding to the two or more channel regions. In an aspect of the subject technology, the circuit further includes a buffer, disposed on the substrate, such that the buffer includes two or more cells that are coupled to the processor and to receive the binary outputs corresponding to the two or more channel regions in turn, such that the binary outputs are pushed by the processor, one by one, to the two or more cells of the buffer. Also, an OR-gate is coupled to each output of the two or more cells of the buffer to provide a logical-OR of the binary outputs corresponding to the two or more cells and generate the logical-OR of the binary outputs. In an aspect of the subject technology, in response to the logical-OR of the binary outputs being a true, the substrate is defective.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multi-tasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit, comprising:
   a substrate;
   first and second power devices disposed on the substrate, wherein the first power device comprises a first field effect transistor (FET) and the second power device comprises a second FET;
   a first channel region located between a first drain and a first source of first FET and a second channel region located between a second drain and a second source of second FET, wherein:
      first and second drains are coupled to each other at a first common junction,
      first and second sources are coupled to each other at a second common junction, and
      the first common junction is configured to receive a current;
   a switch controller coupled to a first gate of the first FET and to a second gate of the second FET, wherein the switch controller is configured to apply a bias voltage to the first and second gates one by one and in turn, wherein at each turn, one FET is on and other FET is off; and
   an analog to digital converter (ADC) coupled to the first common junction and the second common junction and configured to alternately digitize a voltage of the first channel region or the second channel region.

2. The circuit of claim 1, further comprising:
   a processor disposed on the substrate and configured to receive the digitized voltage of the first channel region or the second channel region, compare the digitized voltage with a predefined source-drain voltage range and generate a binary output, wherein the binary output is true if the digitized voltage is not within the predefined source-drain voltage range and the binary output is false if the digitized voltage is within the predefined source-drain voltage range, wherein the processor is configured to receive, in turn, the digitized voltage of the first and second FETs and provide the binary output corresponding to the first and second FETs.

3. The circuit of claim 2, further comprising:
   a buffer having first and second cells and coupled to the processor and configured to receive binary outputs corresponding to the first and second FETs in turn; and
   an OR-gate coupled to each output of the first and second cells of the buffer and configured to provide a logical-OR of the binary outputs corresponding to the first and second FETs and generate the logical-OR as output of the circuit.

4. The circuit of claim 1, wherein the first and second FETs are connected in parallel between the first common junction and the second common junction, and wherein the second common junction is coupled to a ground.

5. The circuit of claim 1, further comprising:
   a current source coupled to the substrate and configured to provide a predetermined amount of current, wherein the current source is coupled to drains of the first and second FETs at the first common junction to provide the current.

6. The circuit of claim 1, further comprising:
   first and second switches disposed on the substrate,
   wherein the switch controller is coupled to each gate of the first and second gates via a separate switch of the first and second switches, wherein the switch controller is configured to close or open the first and second switches one by one and in turn, wherein at each turn, one switch of the first and second switches is closed and other switch of the first and second switches is open, wherein a voltage line is connected to a gate of the FET coupled to the closed switch to turn on the FET coupled to the closed switch in an ohmic region, and wherein the voltage line is disconnected from gates of the other FET coupled to the open switches to turn off the other FET.

7. The circuit of claim 6, wherein a clock signal line is coupled to the first and second switches and coupled to the ADC to synchronize the ADC with turning the first and second switches open or closed.

8. A circuit, comprising:
   a substrate;
   a first field effect transistor (FET) disposed on the substrate;
   a first channel region of the first FET between a first drain and a first source of the first FET, wherein:
      the first drain of the first FET is connected to a first common junction,
      the first common junction is configured to receive a current, and
      the first source of the first FET is connected to a second common junction;
   a first switch disposed on the substrate and coupled between a voltage line and a first gate of the first FET to apply a bias voltage to the first gate;
   a switch controller coupled to the first switch, wherein the switch controller is configured to turn the first switch closed or open in response to a clock signal change; and
   an analog to digital converter (ADC) coupled between the first common junction and the second common junction and configured to digitize a voltage between the first source and the first drain and provide a digitized voltage, wherein the digitized voltage is provided in response to the clock signal change, wherein the clock signal change is configured to close the first switch and turn the first FET on.

9. The circuit of claim 8, wherein the first channel region of the first FETs is an n-type channel, and wherein the clock signal change is from a first voltage level to a second voltage level, higher than the first voltage level.

10. The circuit of claim 8, further comprising:
second and third FETs comprising second and third channel regions respectively between drain and source of the second and third FETs, wherein drains of the second and third FETs are connected to the first common junction and sources of the second and third FETs are connected the second common junction; and
second and third switches disposed on the substrate and coupled between the voltage line and gates of the second and third FETs to apply the bias voltage to the gates of the second and third FETs respectively, wherein the switch controller is configured to make the first, the second, and the third switches closed or open, in turn, in response to the clock signal change, wherein at each turn, one FET is biased to be on and other FETs are off, and wherein the ADC is configured to digitize the voltage between the source and the drain of the one FET that is biased.

11. The circuit of claim 10, wherein the first, second, and third FETs are uniformly distributed in the substrate.

12. The circuit of claim 10, further comprising:
a processor disposed on the substrate and configured to receive the digitized voltage, compare the digitized voltage with a predefined source-drain voltage range and generate a binary output, wherein the binary output is true if the digitized voltage is not within the predefined source-drain voltage range and the binary output is false if the digitized voltage is within the predefined source-drain voltage range, wherein the processor is configured to receive, in turn, digitized voltages of the first, second, and third FETs and to provide binary outputs corresponding to the first, second, and third FETs.

13. The circuit of claim 12, further comprising:
a buffer coupled to a clock signal line and to the processor, wherein the buffer is disposed on the substrate and has three cells, wherein the buffer is configured to receive binary outputs corresponding to the first, second, and third FETs in turn, and to push the binary outputs, one by one, to the three cells of the buffer; and
an OR-gate coupled to each output of the three cells of the buffer and configured to generate a logical-OR of the binary outputs corresponding to the first, second, and third FETs and to provide the logical-OR as an output of the circuit.

14. The circuit of claim 13, wherein in response to the output of the circuit being a logical-one, the circuit is configured to provide an indication that the substrate is defective.

15. A circuit, comprising:
a substrate;
two or more channel regions disposed on the substrate, wherein each channel region has a first end and a second end, wherein the first end of the two or more channel regions are coupled to a first common junction and the second end of the two or more channel regions are coupled to a second common junction and the second common junction is coupled to a ground;
a switch controller coupled to the two or more channel regions, wherein the switch controller is configured to apply a bias voltage to the channel regions one by one and in turn, wherein in response to applying the bias voltage to each channel region, the channel region is configured to become conductive, and wherein at each moment, one channel region of the two or more channel regions is conductive and other channel regions of the two or more channel regions are non-conductive; and
an analog to digital converter (ADC) coupled to the first common junction and the second common junction and configured to digitize one by one and in turn a voltage between first common junction and the second common junction of a channel region that is conductive and provide a digitized voltage.

16. The circuit of claim 15, further comprising:
two or more switches disposed on the substrate, wherein a separate switch of the two or more switches is coupled to each channel region of the two or more channel regions.

17. The circuit of claim 15, wherein the substrate is configured to be coupled, at the first common junction, to a current source to provide a current through the channel region that is conductive.

18. The circuit of claim 15, further comprising:
a processor disposed on the substrate and configured to receive the digitized voltage, compare the digitized voltage with a predefined source-drain voltage range and generate a binary output, wherein the binary output is true if the digitized voltage is not within the predefined source-drain voltage range and the binary output is false if the digitized voltage is within the predefined source-drain voltage range, wherein the processor is configured to receive, in turn, digitized voltages of the two or more channel regions and to provide binary outputs corresponding to the two or more channel regions.

19. The circuit of claim 18, further comprising:
a buffer, disposed on the substrate, wherein the buffer comprises two or more cells that are coupled to the processor and configured to receive the binary outputs corresponding to the two or more channel regions in turn, wherein the binary outputs are pushed by the processor, one by one, to the two or more cells of the buffer; and
an OR-gate coupled to each output of the two or more cells of the buffer and configured to provide a logical-OR of the binary outputs in the two or more cells and generate the logical-OR of the binary outputs.

20. The circuit of claim 19, wherein in response to the logical-OR of the binary outputs being a true, the substrate is defective.

* * * * *